United States Patent [19]
Moon

[11] Patent Number: 6,140,159
[45] Date of Patent: *Oct. 31, 2000

[54] METHOD FOR ACTIVATING AN OHMIC LAYER FOR A THIN FILM TRANSISTOR

[75] Inventor: Dae Gyu Moon, Kyungki-Do, Rep. of Korea

[73] Assignee: LG Electronics Inc., Seoul, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/635,862

[22] Filed: Apr. 22, 1996

[30] Foreign Application Priority Data

Oct. 7, 1995 [KR] Rep. of Korea ................. 95-34442

[51] Int. Cl.$^7$ ............................................... H01L 21/786
[52] U.S. Cl. ........................... 438/151; 438/149; 438/162
[58] Field of Search .................... 438/149, 151, 438/162

[56] References Cited

U.S. PATENT DOCUMENTS

| | | | |
|---|---|---|---|
| 5,141,885 | 8/1992 | Yoshida et al. | 437/41 |
| 5,198,371 | 3/1993 | Li | 438/475 |
| 5,403,756 | 4/1995 | Yoshinouchi et al. | 437/24 |
| 5,504,020 | 4/1996 | Aomori et al. | 437/40 |
| 5,567,633 | 10/1996 | Gosain et al. | 437/40 |
| 5,620,906 | 4/1997 | Yamaguchi et al. | 438/162 |
| 5,677,211 | 10/1997 | Kaneko et al. | 437/40 |

FOREIGN PATENT DOCUMENTS

| | | |
|---|---|---|
| 64-81366 | 3/1989 | Japan . |
| 4-124879 | 4/1992 | Japan . |
| 5-175232 | 7/1993 | Japan . |

OTHER PUBLICATIONS

Concise English Statement of Relevance of Japanese Patent Laid Open 4–124879.
Concise English Statement of Relevance of Japanese Patent Laid Open 5–175232.
Concise English Statement of Relevance of Japanese Patent Laid Open 64–81366.
Mimura et al., A 10 s Doping Technology for the Application of Low–Temperature Polysilicon TFT's to Giant Microelectgronics, 40 (3) :513–518 Mar. 1993.

*Primary Examiner*—Michael P. Woodward
*Assistant Examiner*—Michael Borin
*Attorney, Agent, or Firm*—Finnegan, Henderson, Farabow, Garrett & Dunner, L.L.P.

[57] ABSTRACT

An ohmic layer of CMOS TFT is activated at temperature less than 550° C. by doping N-type and P-type dopants into polycrystal semiconductor to form CMOS thin film transistor and then implanting hydrogen ions into CMOS thin film transistor into which the N-type ions and the P-type ions are doped. The hydrogen ions are generated from a plasma which is produced from a hydrogen containing gas(e.g., phosphine or diborane) and the implantation of the hydrogen ions is carried out by a magnetic mass spectroscopy or an ion doping apparatus in the same chamber where the doping of the N-type ions and the P-type ions is carried out.

14 Claims, 3 Drawing Sheets

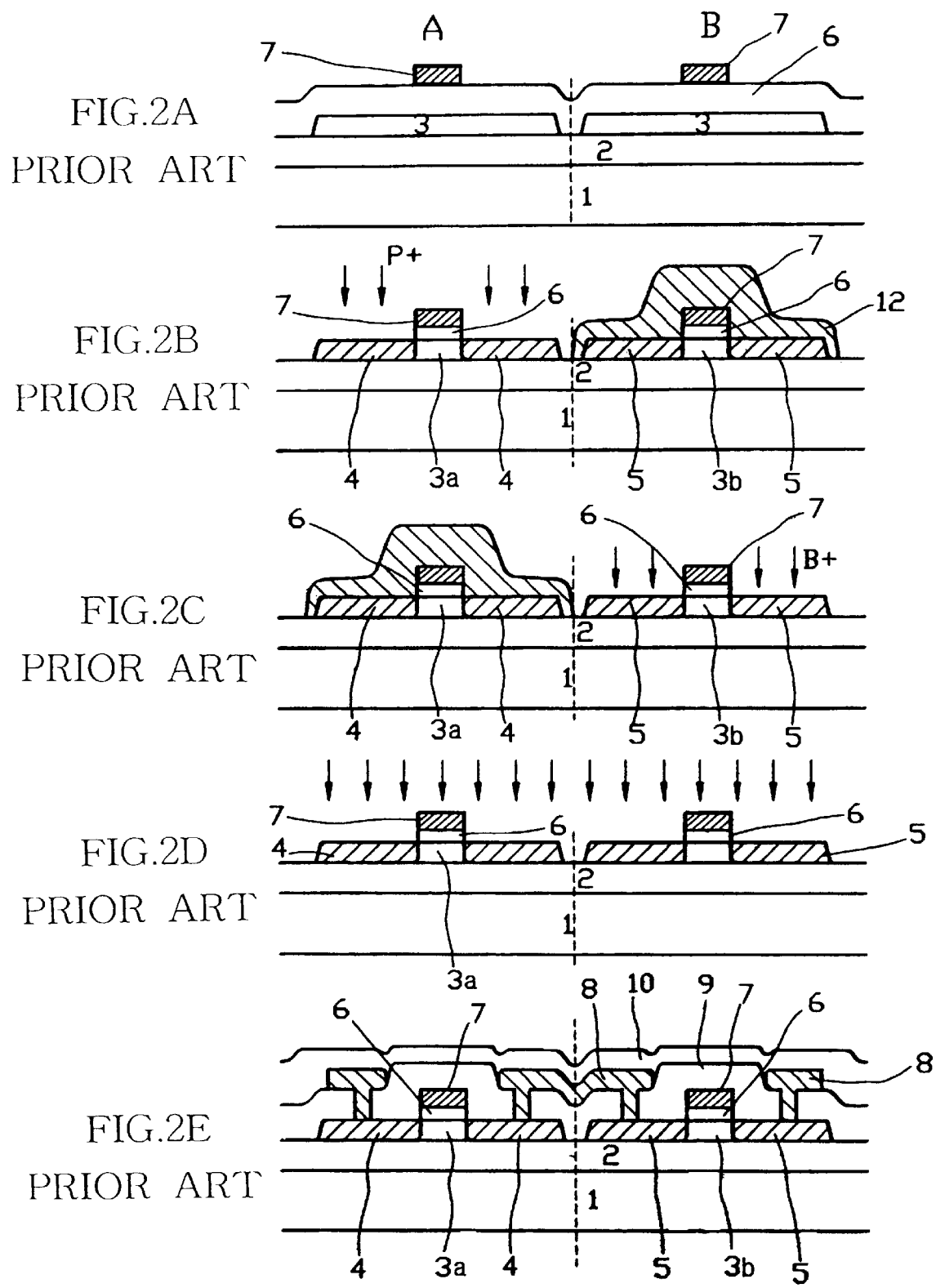

METHOD FOR ACTIVATING AN OHMIC LAYER FOR A THIN FILM TRANSISTOR

BACKGROUND OF THE INVENTION

The present invention relates to a thin film transistor(TFT) processing, and more particularly to process for forming an ohmic layer by activating dopant impurities using hydrogen ion implantion or doping to provide low resistance ohmic contrast to the source and drain of a TFT.

Thin film transistors(TFTs) are generally used for operating an active matrix liquid crystal display(AMLCD). Up until recently, amorphous silicon(a-Si) has been normally used for forming TFTs in AMLCDs. The field effective mobility of an a-Si TFT, however is much lower than that of crystalline Si TFT, so that poly-Si TFT can be employed for large screen TV panel, note book PC panel and monitor panel with integrated driver circuits. Since driver integrated circuit can be formed on the LCD panel, the number of the connections between the driver IC and other pixel elements can be minimized. Thus, a more efficient and economic LCD panel can be obtained. For integrated circuit, CMOS circuit is necessary since it gives the simple circuit design and high speed driving.

In the p-Si TFT, however, glass is employed as a substrate, accordingly, various process steps used to fabricated the p-Si TFT must be carried out at temperatures below 600° C., which is lower than a softening point of glass. In particular, both formation of the channel layer and activation of source/drain implanted regions must be performed at these relatively low temperatures.

After introducing dopants into the p-Si, two methods of the ohmic layer have been proposed so far. These are thermal activation and laser activation. When thermal activation method is applied, low cost glass substrates typically warp because the activation process is carried out above 600° C., which is higher than softening point of glass. On the other hand, when laser activation method is applied, also, the date electrodes including Al, Ta, or Cr can be damaged by the laser beam, so that the gate electrode must be formed of a metal resistant to the laser light, such as polysilicon. Polysilicon, however, has relative high electrical resistivity.

FIG. 1 is a sectional view of conventional p-Si CMOS TFT. In figure, a NMOS and a PMOS TFTs are fabricated in parts A and B of the substrate 1, respectively. A buffer layer 2, channel regions 3A or 3B, an N-type source and drain regions 4, and P-type source and drain regions 5, which are formed of p-Si, and a gate insulating layer 6 are formed successively on glass substrate 1. Here, N-type source and drain regions 4 are formed in part B in which PMOS is fabricated.

The gate insulating layer 6 is coated on the channel regions 3A or 3B, as well as ohmic layers 4 and 5, and the gate electrode 7 is formed on the gate insulating layer 6. An interlayer insulating layer 9 is coated on the gate insulating layer 6 and source-drain contact holes are formed in the interlayer insulating layer 9 and the gate insulating layer 6. Source-drain electrodes 8 are then formed in the contact holes. And, on the above mentioned TFT, a passivation layer 10 is coated.

Hereinafter, the conventional process of fabricating p-Si TFT CMOS will be explained with reference to FIGS. 2A–2E as follows.

The buffer layer 2 and the active layer 3 are deposited on glass substrate 1, as shown in FIG. 2A. The active layer 3 is patterned and then the gate insulating layer 6 is coated on the active layer 3 and the buffer layer 2. Gate metal is then coated and patterned on gate insulating layer 6 to form the gate electrode 7. Thereafter, a photoresist 12 is coated for blocking the P-type transistor of the patterned active layer 3, and N-type dopant doping is then carried out into the p-Si layer 3, as shown in FIG. 2B. Subsequently, P-type dopant doping is carried out after the elimination of the photoresist 12, as shown in FIG. 2C.

Dopants which are doped into the active layer 3 are activated by laser or heat to form the source and drain regions of the N-type and P-type transistors, as shown in FIG.2D. Since the activation temperature must be high enough to form the source and drain regions and the dopants must be activated at temperatures higher than approximate 600° C., there is a possibility that the glass used for substrate may be warpaged or shrinked. Further, if laser activation is used, in addition, typical lasers such as KrF and XeCl eximer laser are employed over the entire surface of the substrate 1, not just the source-drain regions so that the gate electrode 7 can be damaged. For this reason, gate electrode 7 must be made of material highly resistant to laser irradiation.

Thereafter, the interlayer insulating layer 9 is coated and patterned to form the source-drain contact hole. The source-drain electrode 8 is coated in the source-drain contact hole and, lastly, a passivation layer 10 is coated on substrate 1, as shown in FIG.2E.

As noted above, however, glass substrates can be warped it the thermal activation step is carried about at temperatures higher than 600° C. Further, if the laser activation method is used, the gate can only be formed of material unaffected by laser light. Such material, e.g., polysilicon, has relatively high electrical resistance. Low resistance materials typically cannot be used. In addition, to prevent the damage of the photoresist for blocking the P-type and N-type transistors, ion doping must also be carried out at sufficient low temperature.

SUMMARY OF THE INVENTION

It is an object of the present invention to provide a method for activating an ohmic layer for a thin film transistor having source and drain ohmic layer with low resistivity.

In order to achieve the object of the present invention, N-type dopant and P-type dopant are doped into a polysilicon layer, which result to damage the crystal grains of the polysilicon in ohmic region of the TFT, thereby rendering portions of the polysilicon layer amorphous. The amorphous regions, however, are converted back to polysilicon by implanting hydrogen ions at temperatures less than 550° C. which rearrange the silicon atoms. Since the diffusion coefficient of implanted hydrogen ions is high in the polysilicon film, hydrogen ions can move throughout the film during implantation, thereby activating the ohmic contact of the TFT.

BRIEF DESCRIPTION OF THE DRAWINGS

FIGS. 2A–2E are sectional views illustrating the conventional process for activating an ohmic layer in a polysilicon thin film transistor.

DETAILED DESCRIPTION OF THE INVENTION

A detailed description of a preferred embodiment of the present invention will now be made with reference to FIGS.

Figure 1:
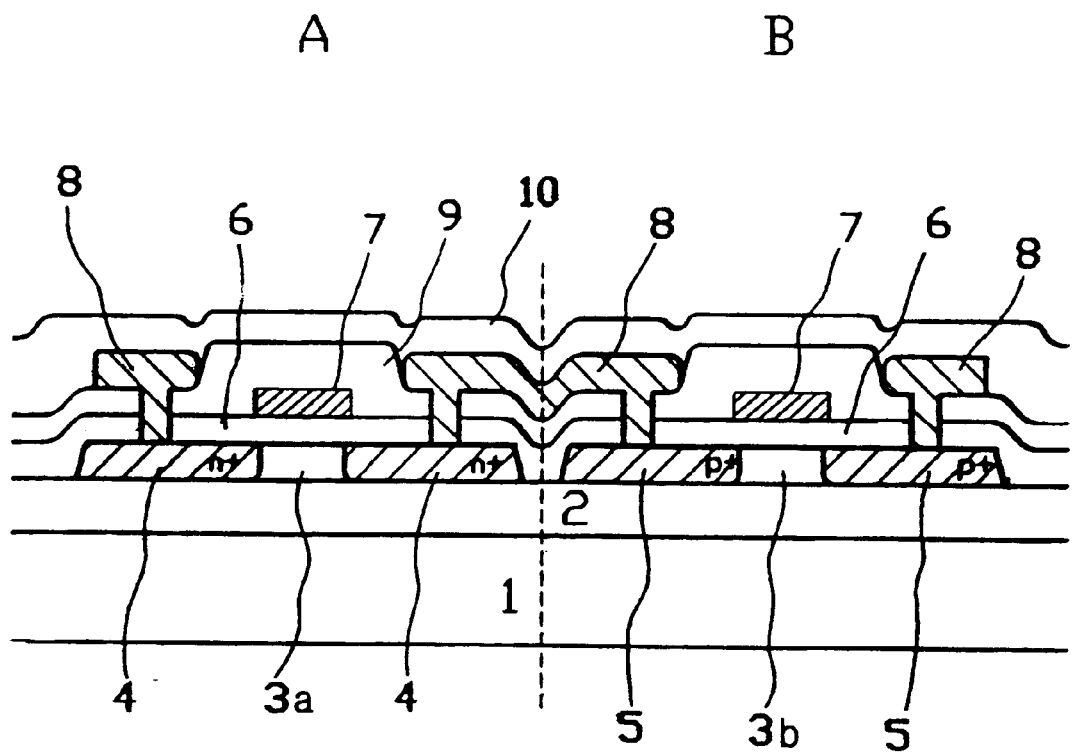
FIG. 1 is a sectional view of the polysilicon thin film transistor.
Figure 3A:
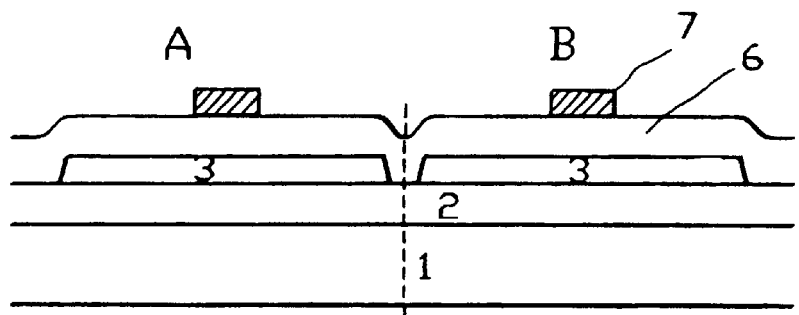
FIGS. 3A–3E are sectional views illustrating a process for activating the ohmic layer in a polysilicon thin film transistor according to the present invention.
Figure 3B:
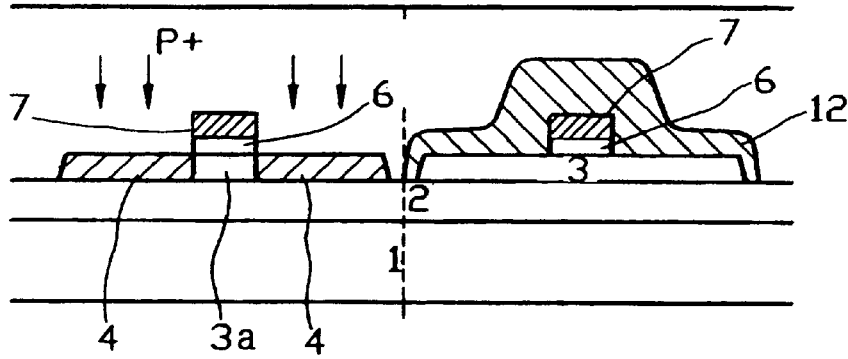

3A–3E. Referring to FIG. 3A, a buffer layer 2 is first deposited on the glass substrate 1. Polysilicon, p-Si, layer is next formed on buffer layer 2, and patterned to form an active layer 3. The gate insulating layer 6 and metal gate electrode 7, are successively deposited and patterned, as shown in FIG. 3A–3B. As further shown in FIG. 3B, photoresist layer 12 is coated on the substrate to cover area B of the active layer 3 corresponding to P-type transistor, and N-type dopants are doped into the N-type transistor region A of active layer 3 to form a channel region 3a and source/drain ohmic regions 4. The photoresist is then removed. The N-type dopants, i.e., phosphorus ions($P^+$) are generated from a plasma which is produced by applying high voltage to a vacuum chamber filled with $PH_3$ molecules.

Figure 3C:
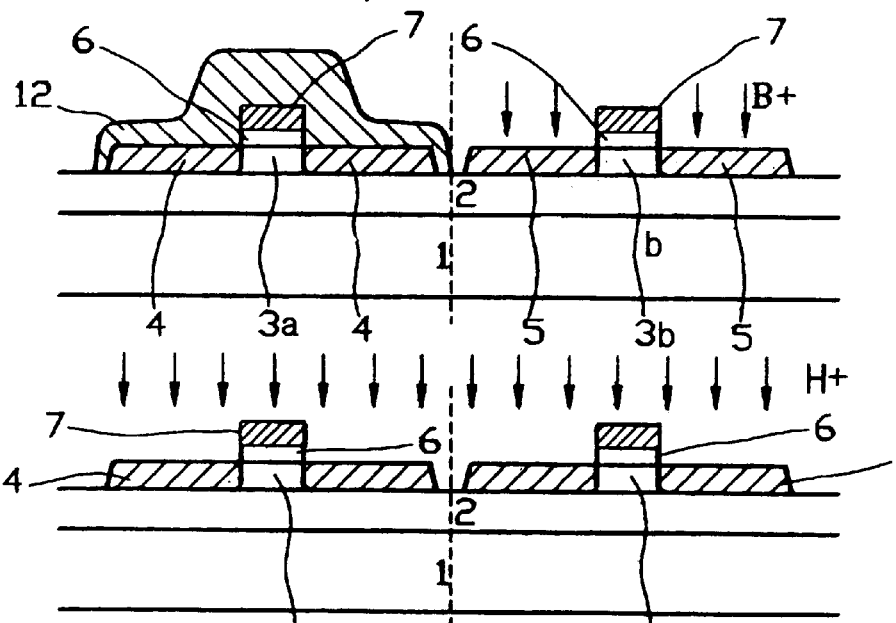

As shown in FIG. 3C, photoresist 12 is also patterned to cover N-type transistor region A, and P-type dopants are doped into the P-type transistor region B to form a channel region 3b, and source/drain regions 5. The photoresist is then removed. Here, by applying high voltage to the vacuum chamber in which doping gas, $B_2H_6$, is filled, a plasma is produced so that the boron ions($B^+$) from the plasma are doped into the p-Si layer 3.

Figure 3D:
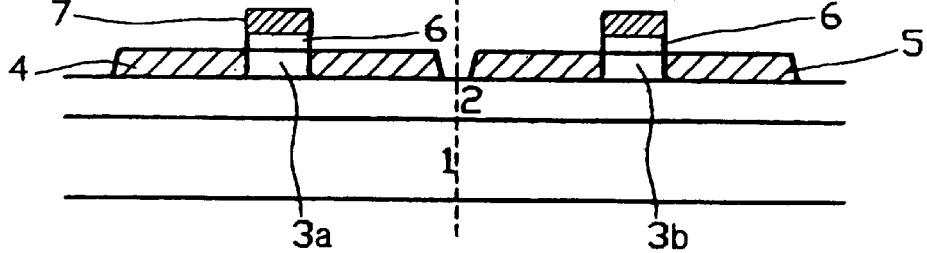

Subsequently, as shown in FIG. 3D, after the plasma is produced from $PH_3$ or $B_2H_6$, $PH_3$ or $B_2H_6$ is ionized in various forms in the vacuum chamber in which P-type ions and N-type ions are doped into the p-Si layer 3. Hydrogen ions($H^+$) are then implanted into the N-type and P-type regions of transistors by magnetic mass spectroscopy(MMS) or by using a non mass separating ion doping apparatus. In either case, the hydrogen ions are preferably introduced at temperatures less than 550° C. Because the diffusion coefficient of the implanted hydrogen ions in the p-Si film is large, the hydrogen ions move throughout the p-Si film. Accordingly, the atomic arrangement of the N-type($P^+$) or P-type($B^+$) source and drain regions 4 and 5, which had been altered and rendered amorphous during the previous doping step, is rearranged, thereby activating the N-type dopants and P-type dopants and converting these amorphous regions to polysilicon.

Figure 3E:
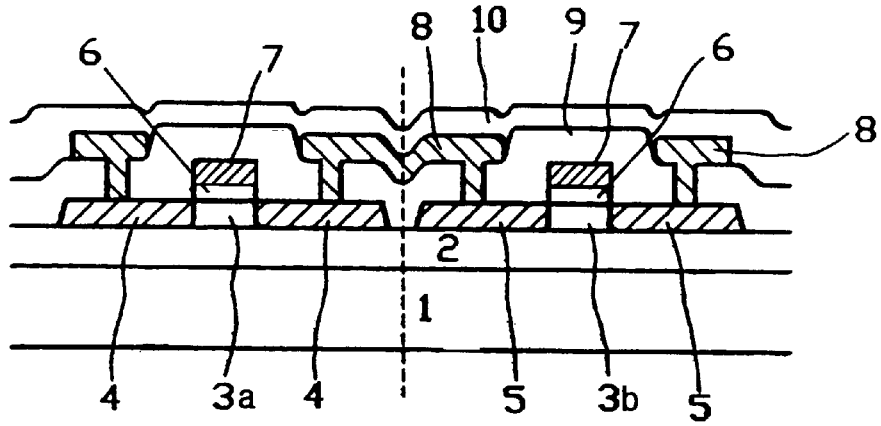

As shown in FIG. 3E, the interlayer insulating layer 9 is coated and patterned to form the source-drain contact hole. A source-drain electrode 8 are next coated into the source-drain contact hole, and the passivation layer 10 is coated thereon.

In the above-described TFT in accordance with the present invention, since the implantation of hydrogen ions is carried out at the temperature lower than 550° C., and then phosphorus ions and boron ions are activated at temperatures less than 550° C. to form the ohmic layer, the damage of the glass substrate and the gate electrode caused by thermal and/or laser activation method can be prevented. In the TFT process in accordance with the present invention, therefore, an inexpensive glass substrate can be used, as well as gate electrode material having low resistivity. In addition, the doping of P-type dopants and N-type dopants and the implantation of the hydrogen ions are carried out in the same vacuum chamber so that additional steps in the TFT manufacturing process can be skipped. Accordingly, fewer steps are required than in the process using thermal and laser activation.

While the present invention contains polysilicon thin film transistor as a preferred embodiment, this should not be construed as limitation on the scope of the present invention. For example, the applications such as single crystal thin film transistor or amorphous thin film transistor are ramifications of the present invention while not shown in drawings. Accordingly, the scope of the invention should be determined not by the embodiment illustrated, but by the appended claims and their legal equivalents.

What is claimed is:

1. A method for manufacturing a thin film transistor, comprising the steps of:

introducing impurities selected from the group of N-type dopant and P-type dopant into portion of a polycrystalline semiconductor film provided on a substrate thereby rendering said portions of said polycrystalline semiconductor amorphous, said polycrystalline semiconductor film forming a part of said thin film transistor; and implanting hydrogen ions into said amorphous portions of said polycrystalline semiconductor film after the impurities have been introduced to activate said amorphous portions of said polycrystalline semiconductor film, whereby the silicon atoms of the amorphous portions are rearranged.

2. A method for activating an ohmic layer of a thin film transistor according to claim 1, wherein said introducing step and said implanting step are performed in a single vacuum chamber.

3. A method for activating an ohmic layer of a thin film transistor according to claim 1, wherein said step of implanting hydrogen ions is performed at a temperature less than or equal to 550° C.

4. A method for activating an ohmic layer of a thin film transistor according to claim 1, further including the steps of:

generating a plasma; and introducing a gas containing hydrogen into said plasma to generate said hydrogen ions.

5. A method for activating an ohmic layer of a thin film transistor according to claim 4, wherein said gas is selected from the group of $PH_3$ and $B_2H_6$.

6. A method for activating an ohmic layer of a thin film transistor according to claim 3, wherein said step of implanting said hydrogen ions is performed with an apparatus selected from the group of a magnetic mass spectroscopy apparatus and an ion doping apparatus.

7. A method for manufacturing a thin film transistor comprising the steps of:

doping a polycrystalline semiconductor layer with N-type dopants and P-type dopants to form amorphous source and drain regions in each of a plurality of polycrystalline CMOS thin film transistors; and implanting hydrogen ions into said amorphous source and drain regions after doping the polycrystalline semiconductor layer to activate said source and drain regions, whereby the silicon atoms of the amorphous portions are rearranged.

8. A method for activating an ohmic layer according to claim 7, wherein said doping step and said implanting step are performed in a single chamber.

9. A method for activating an ohmic layer according to claim 7, wherein said doping step and said implanting step are performed at a temperature less than or equal to 550° C.

10. A method for activating an ohmic layer of a thin film transistor according to claim 7, further including the steps of:

generating a plasma; and introducing a gas containing hydrogen into said plasma to generate said hydrogen ions.

11. A method for activating an ohmic layer of a thin film transistor according to claim 10, wherein said gas is selected from the group of $PH_3$ and $B_2H_6$.

12. A method for activating an ohmic layer of a thin film transistor according to claim 7, wherein said step of implanting said hydrogen ions is performed with an apparatus selected from the group of a magnetic mass spectroscopy apparatus and an ion doping apparatus.

13. A method for forming a semiconductor device comprising the steps of:

forming a first polycrystalline semiconductor layer on a substrate;

implanting impurities into said first polycrystalline semiconductor layer thereby converting said first polycrystalline layer into an amorphous semiconductor layer; and thereafter, implanting hydrogen ions into said amorphous semiconductor layer to convert said amorphous semiconductor into a second polycrystalline semiconductor layer and to activate said second polycrystalline semiconductor layer, whereby the silicon atoms of the amorphous semiconductor layer are rearranged.

14. A semiconductor device comprising:

a substrate having a surface;

a polycrystalline layer formed on said surface of said substrate;

a plurality of doped regions formed in said polycrystalline layer having a first conductivity type, each of said plurality of doped regions having been formed by first implanting impurities to the polycrystalline layer and, thereafter, implanting hydrogen ions to activate and rearrange the silicon atoms of said plurality of doped regions.

* * * * *